US009560741B2

United States Patent
Rose et al.

(10) Patent No.: US 9,560,741 B2
(45) Date of Patent: Jan. 31, 2017

(54) CIRCUIT BOARD VIA CONFIGURATIONS FOR HIGH FREQUENCY SIGNALING

(71) Applicant: Curtiss-Wright Controls, Inc., Charlotte, NC (US)

(72) Inventors: Michael Rose, Marion, MA (US); Robert Sullivan, Wareham, MA (US)

(73) Assignee: Curtiss-Wright Controls, Inc., Charlotte, NC (US)

( * ) Notice: Subject to any disclaimer, the term of this patent is extended or adjusted under 35 U.S.C. 154(b) by 116 days.

(21) Appl. No.: 14/511,397

(22) Filed: Oct. 10, 2014

(65) Prior Publication Data

US 2015/0114706 A1    Apr. 30, 2015

Related U.S. Application Data

(60) Provisional application No. 61/889,252, filed on Oct. 10, 2013.

(51) Int. Cl.
*H05K 1/02* (2006.01)
*H05K 1/11* (2006.01)

(52) U.S. Cl.
CPC ........... *H05K 1/0251* (2013.01); *H05K 1/0245* (2013.01); *H05K 1/0298* (2013.01); *H05K 2201/0187* (2013.01); *H05K 2201/09063* (2013.01); *H05K 2201/09718* (2013.01); *H05K 2201/1059* (2013.01)

(58) Field of Classification Search
CPC .... H05K 1/0251; H05K 1/0245; H05K 1/115; H05K 1/116; H05K 2201/09063; H05K 2201/09718

USPC .......................................................... 174/262
See application file for complete search history.

(56) References Cited

U.S. PATENT DOCUMENTS

| | | |
|---|---|---|
| 6,407,460 B1 | 6/2002 | Horiuchi et al. |
| 6,486,414 B2 | 11/2002 | Kobayashi et al. |
| 6,614,325 B1 | 9/2003 | Kocin |
| 6,889,367 B1 | 5/2005 | Frank et al. |
| 7,102,455 B2 | 9/2006 | Lin et al. |

(Continued)

OTHER PUBLICATIONS

X. Wu; D. Dunham; N. Nanju; J. A. Hejase, An Air-Dielectric Via Structure for 20GBPS+ Board Connectors, Elec. Comp. and Tech. Conf. (ECTC), 2013 IEEE 63rd, May 31, 2013 pp. 1175-1178.

(Continued)

*Primary Examiner* — Hoa C Nguyen
*Assistant Examiner* — Amol Patel
(74) *Attorney, Agent, or Firm* — Onello & Mello, LLP

(57) ABSTRACT

A circuit board comprises a plurality of layers, first and second reference conductive vias extending in a vertical direction through at least a portion of the plurality of layers, first and second signal conductive vias extending in the vertical direction between and spaced apart in a horizontal direction from the first and second reference conductive vias through at least a portion of the plurality of layers, and a dielectric region extending in the vertical direction between the first and second signal conductive vias. An air via extends in the vertical direction through the dielectric region between the first and second signal conductive vias. An anti-pad extends in the horizontal direction between the first and second reference conductive vias and surrounding in the horizontal direction the first and second signal conductive vias, the air via, and the dielectric region.

36 Claims, 11 Drawing Sheets

(56) References Cited

U.S. PATENT DOCUMENTS

| | | |
|---|---|---|
| 7,230,506 B2 | 6/2007 | Beale et al. |
| 7,666,009 B2 | 2/2010 | Minich et al. |
| 7,708,569 B2 | 5/2010 | Sereu et al. |
| 7,750,765 B2 | 7/2010 | Kushta et al. |
| 7,830,223 B2 | 11/2010 | Ahmad |
| 7,833,026 B1 | 11/2010 | Morgan et al. |
| 7,862,347 B2 | 1/2011 | Amleshi et al. |
| 7,868,257 B2 | 1/2011 | Kushta et al. |
| 7,897,880 B1 | 3/2011 | Goergen et al. |
| 7,980,896 B1 | 7/2011 | Morgan |
| 8,035,992 B2 | 10/2011 | Kushta et al. |
| 8,319,116 B2 | 11/2012 | Martinez-Vargas et al. |
| 8,338,911 B2 | 12/2012 | Miki et al. |
| 8,476,537 B2 | 7/2013 | Kushta |
| 8,536,464 B2 | 9/2013 | Kushta et al. |
| 2003/0070931 A1 | 4/2003 | Kitchens |
| 2006/0185890 A1* | 8/2006 | Robinson ............ H05K 1/0216 174/255 |
| 2008/0217051 A1 | 9/2008 | Matsui |
| 2011/0267783 A1* | 11/2011 | Mutnury ................ H05K 1/024 361/748 |
| 2012/0105096 A1 | 5/2012 | Kuah et al. |
| 2013/0077268 A1 | 3/2013 | Brunker et al. |
| 2013/0098671 A1* | 4/2013 | Thurairajaratnam .. H05K 1/024 174/266 |
| 2013/0099876 A1 | 4/2013 | Kushta |
| 2013/0199834 A1* | 8/2013 | De Geest ............... H05K 1/024 174/266 |
| 2013/0256021 A1 | 10/2013 | Hardin |

OTHER PUBLICATIONS

L. Simonovich, Relative Permittivity Variation Surrounding PCB Via Hole Structures, Signal Propagation on Interconnects, May 15, 2008, SPI 2008, 12th IEEEWorshop on, pp. 1-4.

* cited by examiner

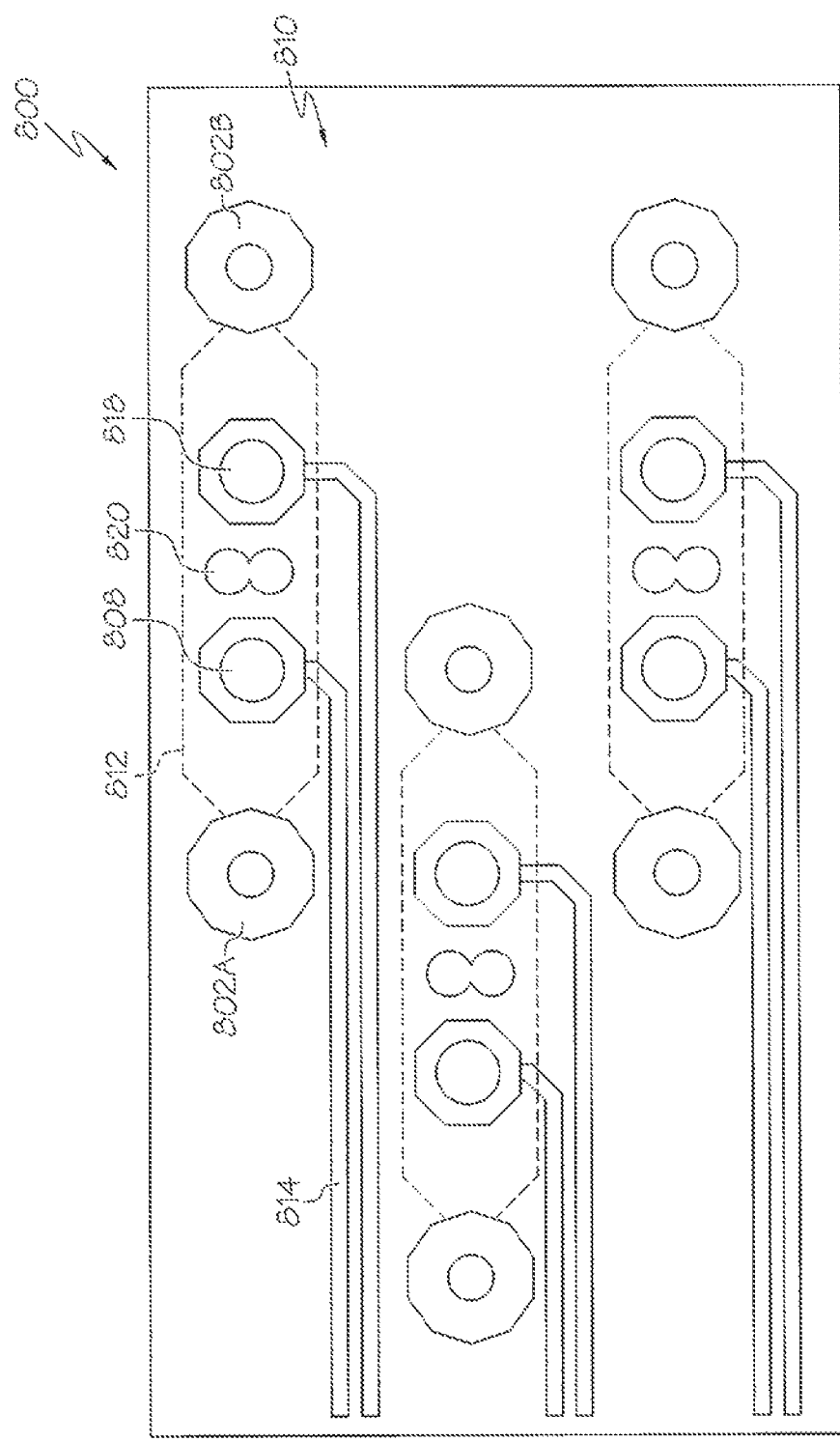

CIRCUIT BOARD VIA CONFIGURATIONS FOR HIGH FREQUENCY SIGNALING

CROSS-REFERENCE TO RELATED APPLICATIONS

This application claims the benefit of priority under 35 U.S.C. §119(e) from commonly owned U.S. provisional patent application Ser. No. 61/889,252, entitled "Circuit Board Via Configurations for High Frequency Signaling," filed Oct. 10, 2013, the content of which is incorporated herein in its entirety.

TECHNICAL FIELD

The present inventive concepts generally relate to the field of circuit board design, and more particularly, to systems and methods for transmitting differential signals at a circuit board.

BACKGROUND

A printed circuit board (PCB) typically includes a plurality of vias that are constructed and arranged to transmit signals between connectors coupled to the vias and various regions of the PCB. A PCB can include other vias, for example, related to single-ended signaling. As signals are exchanged at a multilayer circuit board, for example, with respect to baud rate and frequency, undesirable signal integrity issues can arise at the vias for example, impedance mismatching, noise induced by densely-packed neighboring connections, commonly referred to as crosstalk, signal reflections, signal loss, signal cross coupling, mode conversion for differential signaling, and resonant behavior, and so on.

Constraints related to connector, via, trace, or other element geometries present on a PCB may further limit signaling performance at the PCB.

SUMMARY

In one aspect, provided is a circuit board, comprising one or more layers. At least one layer of the one or more layers has a plurality of conductive paths extending in a horizontal direction. The circuit board further comprises a plurality of conductive vias extending in a vertical direction through the circuit board connected to one or more of the conductive paths and one or more air via(s) or non-plated through hole(s) positioned between first and second neighboring ones of the conductive vias.

In some embodiments, the circuit board of claim 1 further comprises a plurality of connectors that are positioned in, and electrically coupled with, conductive sidewalls of the vias.

In some embodiments, the conductive vias include differential pair signal vias.

In some embodiments, the conductive vias include a single-ended signal via.

In some embodiments, the circuit board is constructed and arranged to include a backplane, a plug-in module, a mezzanine module, or a combination thereof.

In some embodiments, the circuit board includes one or more connectors, conductive traces, vias, surface mount technology (SMT) pads, or a combination thereof.

In some embodiments, the air via(s) or non-plated through hole(s) are cylindrical.

In some embodiments, the air via(s) or non-plated through hole(s) are slot-shaped.

In some embodiments, the air via(s) or non-plated through hole(s) include two or more circle-shaped vias that slightly overlap each other.

In some embodiments, the air via(s) or non-plated through hole(s) are positioned between at least one of the conductive vias and a ground.

In some embodiments, at least one of the conductive vias includes a pad at a top region thereof, and wherein one or more of the conductive vias are devoid of pads at top surfaces thereof.

In some embodiments, a surface of the multiple-layered circuit board has a plurality of conductive pads that are connected to corresponding ones of the conductive vias, the conductive pads having a width in the horizontal direction that is less than a width in the horizontal direction of another conductive via proximal the ones of the conductive vias.

In one aspect, provided is a circuit board, comprising one or more layers, at least one layer of the one or more layers having a plurality of conductive paths extending in a horizontal direction, and a plurality of vias extending in a vertical direction through the circuit board, the vias including at least one conductive via connected to one or more of the conductive paths. A top surface of the circuit board has a plurality of conductive pads that are connected to corresponding ones of the conductive vias. A first set of the conductive pads has a first width in the horizontal direction. A second set of the conductive pads has a second width in the horizontal direction. The first width is less than the second width.

In some embodiments, the circuit board further comprises one or more air via(s) or non-plated through hole(s) positioned adjacent the at least one conductive via.

In some embodiments, the at least one pair of conductive via comprises differential pair signal vias, and wherein the air via(s) or non-plated through hole(s) are between the differential pair signal vias.

In some embodiments, at least one conductive via comprises a single-ended signal via, and wherein the air via(s) or non-plated through hole(s) are adjacent the single-ended signal via.

In some embodiments, the air via(s) or non-plated through hole(s) are positioned between at least one conductive via and a ground.

In some embodiments, the at least one conductive via is devoid of a pad and a neighboring via includes a pad.

In another aspect, a circuit board, comprises: a plurality of layers; first and second reference conductive vias extending in a vertical direction through at least a portion of the plurality of layers; first and second signal conductive vias extending in the vertical direction between and spaced apart in a horizontal direction from the first and second reference conductive vias through at least a portion of the plurality of layers; a dielectric region extending in the vertical direction between the first and second signal conductive vias; an air via extending in the vertical direction through the dielectric region between the first and second signal conductive vias; and an anti-pad extending in the horizontal direction between the first and second reference conductive vias and surrounding in the horizontal direction the first and second signal conductive vias, the air via, and the dielectric region.

In some embodiments, the first and second signal conductive vias are padless conductive vias.

In some embodiments, the first and second signal conductive vias each has a width that is uniform in the vertical direction through the at least the portion of the plurality of layers.

In some embodiments, the circuit board further comprises a conductive trace extending in the horizontal direction from each of the first and second signal conductive vias for providing an electrical path between conductive elements of the layers.

In some embodiments, the conductive traces extending from the first and second signal conductive vias are the only conductive traces present in the anti-pad.

In some embodiments, the conductive traces extend in the horizontal direction.

In some embodiments, the dielectric region includes a clearance distance between the air via and the conductive traces, so that the conductive traces are unexposed in the air via.

In some embodiments, the circuit board comprises a backplane, a plug-in module, a mezzanine module, or a combination thereof.

In some embodiments, the first and second signal conductive vias are a differential pair.

In some embodiments, the first and second reference conductive vias are ground vias, power vias, or a combination thereof.

In some embodiments, the air via extends from a top layer to a bottom layer of the plurality of layers.

In some embodiments, the air via extends from a top or a bottom layer to an intermediate layer of the plurality of layers.

In some embodiments, the air via extends exclusively between intermediate layers of the plurality of layers, and does not extend to a top or a bottom layer In some embodiments, the circuit board further comprises secondary air slot vias extending in the vertical direction between the first signal conductive via and the first reference conductive via and between the second signal conductive via and the second reference conductive via.

In an aspect, a circuit board comprises: a plurality of layers; first and second reference conductive vias extending in a vertical direction through at least a portion of the plurality of layers; first and second padless signal conductive vias extending in the vertical direction between and spaced apart in a horizontal direction from the first and second reference conductive vias through the layers; a dielectric region extending in the vertical direction between the first and second signal conductive vias; and an anti-pad extending in the horizontal direction between the first and second reference conductive vias and surrounding in the horizontal direction the padless signal conductive vias and the dielectric region.

In some embodiments, the first and second padless signal conductive vias each has a width that is uniform in the vertical direction through the at least the portion of the plurality of layers.

In some embodiments, the circuit board further comprises an air via extending through the dielectric region between the first and second signal conductive vias In some embodiments, the air via extends from a top layer to a bottom layer of the plurality of layers.

In some embodiments, the air via extends from a top or a bottom layer to an intermediate layer of the plurality of layers.

In some embodiments, the air via extends exclusively between intermediate layers of the plurality of layers, and does not extend to a top or bottom layer In some embodiments, the circuit board further comprises secondary air slot vias extending in the vertical direction between the first signal conductive via and the first reference conductive via and between the second signal conductive via and the second reference conductive via.

In some embodiments, the dielectric region includes a clearance distance between the air via and the first and second signal conductive vias In some embodiments, the circuit board further comprises a conductive trace extending in the horizontal direction from each of the first and second signal conductive vias for providing an electrical path between conductive elements of the layers.

In some embodiments, the conductive traces extending from the first and second signal conductive vias are the only conductive traces present in the anti-pad.

In some embodiments, the dielectric region includes a clearance distance between the air via and the first and conductive traces so that the conductive traces are unexposed in the air via.

In some embodiments, the conductive traces extend in a direction that is parallel to the horizontal direction.

In some embodiments, the circuit board comprises a backplane, a plug-in module, a mezzanine module, or a combination thereof.

In some embodiments, the first and second signal conductive vias are a differential pair.

In some embodiments, the first and second reference conductive vias are ground vias, power vias, or a combination thereof.

In another aspect, a circuit board comprises: a plurality of layers; first and second padless signal conductive vias extending in a vertical direction; a dielectric region extending in the vertical direction between the first and second signal conductive vias; a conductive trace extending in the horizontal direction from each of the first and second signal conductive vias for providing an electrical path between conductive elements of the layers; and an air via extending in the vertical direction through the dielectric region between the first and second signal conductive vias, wherein portions of the dielectric region are present between the air via and the signal conductive vias, and between the air via and the conductive traces.

In some embodiments, the first and second signal conductive vias each has a width that is uniform in the vertical direction.

In some embodiments, the circuit board further comprises reference conductive vias extending in the vertical direction through at least a portion of the plurality of layers.

In some embodiments, the circuit board further comprises an anti-pad extending in the horizontal direction between the first and second reference conductive vias and surrounding in the horizontal direction the padless signal conductive vias, the air via, and the dielectric region.

In some embodiments, the conductive traces extending from the first and second signal conductive vias are the only conductive traces present in the anti-pad.

In some embodiments, the conductive traces extend in the horizontal direction.

In some embodiments, the dielectric region includes a clearance distance between the air via and the first and conductive traces so that the conductive traces are unexposed in the air via In some embodiments, the circuit board comprises a backplane, a plug-in module, a mezzanine module, or a combination thereof.

In some embodiments, the first and second signal conductive vias are a differential pair.

In some embodiments, the first and second reference conductive vias are ground vias, power vias, or a combination thereof.

In some embodiments, the air via extends from a top layer to a bottom layer of the plurality of layers.

In some embodiments, the air via extends from a top or bottom layer to an intermediate layer of the plurality of layers.

In some embodiments, the air via extends exclusively between intermediate layers of the plurality of layers, and does not extend to the top or bottom layer In another aspect, a circuit board, comprise: a plurality of layers; first and second reference conductive vias extending in a vertical direction through the layers; first and second signal conductive vias extending in the vertical direction between the first and second reference conductive vias through the layers; a dielectric region extending in the vertical direction between the first and second reference conductive vias from a top layer of the plurality of layers to a bottom layer of the plurality of layers; a conductive trace extending in the horizontal direction from each of the first and second reference conductive vias for providing an electrical path between conductive elements of the layers, wherein the plurality of layers, the first and second reference conductive vias, the first and second signal conductive vias, the conductive traces, and the dielectric region are part of a predetermined geometry and layout of the circuit board; and an air via constructed and arranged for positioning in the dielectric region of the circuit board in compliance with at least one constraint of the predetermined geometry and layout.

In some embodiments, the air via extends in the vertical direction through the dielectric region between the first and second conductive vias in compliance with the at least one of constraint of the layout or geometry constraint of the predetermined geometry and layout.

In some embodiments, the circuit board further comprises an anti-pad between the first and second non-conductive vias and surrounding in the horizontal direction the air via, the conductive vias, and the dielectric region.

In some embodiments, the air via has a geometry that complies with a geometry of the anti-pad.

In some embodiments, the air via is constructed and arranged to have a geometry that accommodates the size of the anti-pad in a manner that avoids the conductive traces.

In some embodiments, the first and second conductive vias are padless vias.

In some embodiments, the air via is surrounded by dielectric material, and the conductive traces extending from the first and second conductive vias, respectively, are each separated from the air via by a predetermined distance established by a geometry constraint of the at least one constraint.

In some embodiments, the circuit board further comprises connector pins in the first and second conductive vias, wherein the air via has a geometry that complies with a constraint of the at least one constraint that includes at least one of a diameter, pitch, or shielding of the connector pins.

In some embodiments, the air via has a geometry that complies with a constraint of the at least one constraint that includes at least a width, spacing, pitch, via pad diameter, or clearance distance of the first and second conductive vias.

In some embodiments, the air via has a geometry that complies with a constraint of the at least one constraint that includes at least one of an air via drill size, registration, or overlap.

In some embodiments, the air via has a geometry that complies with a minimum copper-to-air clearance between the air via and a neighboring conductive element of the predetermined geometry and layout of the circuit board.

In some embodiments, the predetermined geometry and layout of the circuit board includes a plurality of rows of first and second conductive vias, and wherein the conductive traces extend between adjacent rows of the plurality of rows, and wherein the air via has a geometry that maintains a minimum spacing between the non-conductive vias, the conductive traces, and the conductive vias.

In some embodiments, the circuit board is constructed and arranged to include a backplane, a plug-in module, a mezzanine module, or a combination thereof.

In some embodiments, the first and second conductive vias are a differential pair, and the traces are differential signal traces.

In some embodiments, the first and second non-conductive vias are ground vias.

In another aspect, a method for configuring a circuit board for high frequency signaling, comprises: constructing and arranging the circuit board to include a predetermined geometry and layout, including a plurality of layers, first and second reference conductive vias extending in a vertical direction through the layers, first and second signal conductive vias extending in the vertical direction between the first and second reference conductive vias through the layers, a dielectric region extending in the vertical direction between the first and second reference conductive vias from a top layer of the plurality of layers to a bottom layer of the plurality of layers, and a conductive trace extending from each of the first and second signal conductive vias for providing an electrical path between conductive elements of the layers; and forming an air via in the dielectric region of the circuit board in compliance with at least one constraint of the predetermined geometry and layout.

BRIEF DESCRIPTION OF THE DRAWINGS

The foregoing and other objects, features and advantages of embodiments of the present inventive concepts will be apparent from the more particular description of preferred embodiments, as illustrated in the accompanying drawings in which like reference characters refer to the same elements throughout the different views. The drawings are not necessarily to scale, emphasis instead being placed upon illustrating the principles of the preferred embodiments.

FIG. 9 is a plan view of the circuit board of FIG. 8.

DETAILED DESCRIPTION OF EMBODIMENTS

Figure 1:
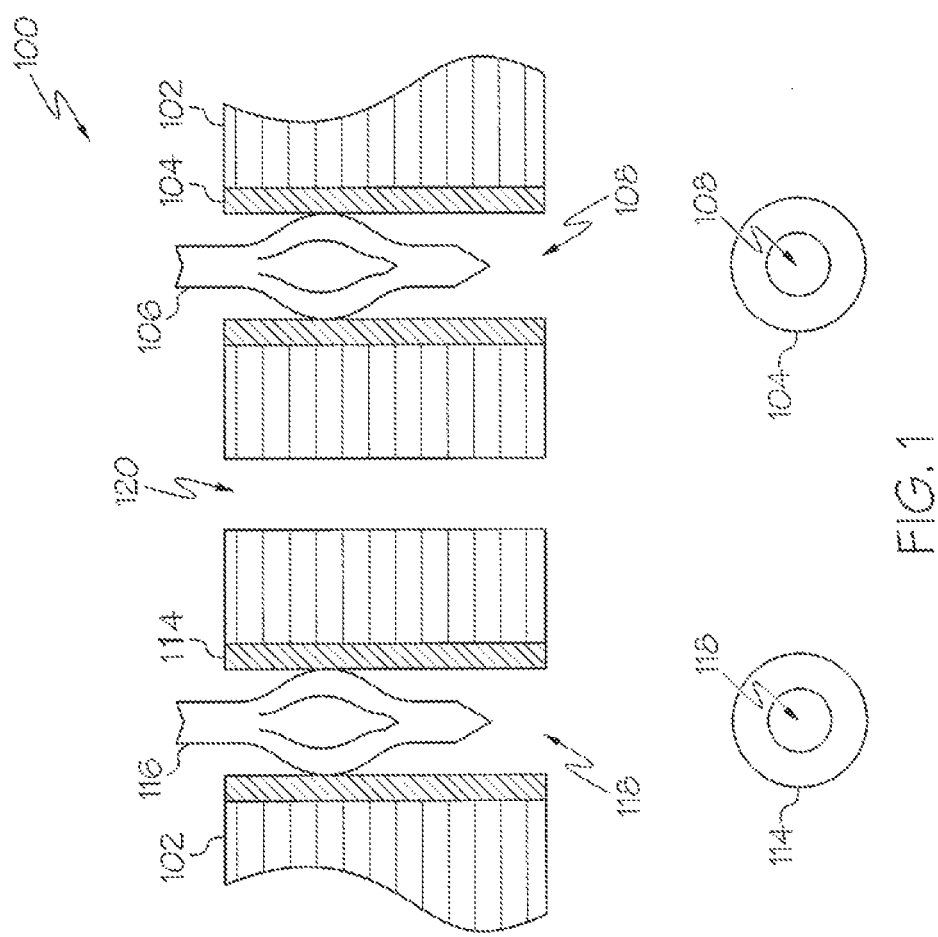
FIG. 1 is a cross-sectional view of a circuit board, in accordance with an embodiment.

The terminology used herein is for the purpose of describing particular embodiments and is not intended to be limiting of the inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various limitations, elements, components, regions, layers and/or sections, these limitations, elements, components, regions, layers and/or sections should not be limited by these terms. These terms are only used to distinguish one limitation, element, component, region, layer or section from another limitation, element, component, region, layer or section. Thus, a first limitation, element, component, region, layer or section discussed below could be termed a second limitation, element, component, region, layer or section without departing from the teachings of the present application.

It will be further understood that when an element is referred to as being "on" or "connected" or "coupled" to another element, it can be directly on or above, or connected or coupled to, the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

Elements of a signal path through a circuit board can include but not be limited to connectors, conductive traces, signal vias, reference vias such as power vias, ground vias, and so on, and/or surface mount technology (SMT) pads, or related conductive elements, any of which can have an impact on signal integrity. A well-known issue with conventional circuit board designs is that the implementation of press-fit or solder tail connectors may result in a high speed differential pair or single ended signal via impedance mismatch, crosstalk issues based on the geometry, spacing, and/or pitch of the differential pair or single ended vias and/or nearby ground vias, which may have a negative impact on signal performance. Connector or via transitions may often have a lower impedance due to the capacitive nature of the via pad and barrel to the plane cutout through which it passes. In such configurations, it is desirable to minimize the impedance discontinuity so that a uniform impedance is accomplished through these type of transitions. Other issues related to single-ended signaling may arise with such circuit board designs. Example issues may relate to but not be limited to return loss, transmission loss, signal reflections, signal cross coupling, mode conversion for differential signaling, and resonant behavior. These issues are compounded by a number of physical constraints, such as connector pin and trace dimensions, thereby limiting the signaling performance in a conventional PCB.

FIG. 1 is a cross-sectional view of a circuit board 100, in accordance with an embodiment. The circuit board 100 can be, but not limited to, a multi-layer PCB. In some embodiments, the circuit board 100 is part of a backplane. In other embodiments, the circuit board 100 is part of a plug-in module, a mezzanine module, and/or other module known to those of ordinary skill in the art. At least one layer can have a plurality of conductive paths for transferring voltage signals to other elements in the circuit board 100 and/or external components. One or more conductive traces (not shown) can be disposed at various locations at or between different layers of the circuit board 100. The circuit board 100 can include but not be limited to via stubs, for example, controlled via stubs by back-drilling, sequential lamination, blind or buried vias, and the like, or other electronic circuit board components known to those of ordinary skill in the art, which are not shown or described herein for purposes related to brevity.

The circuit board 100 includes a pair of conductive vias 108, 118 that extend through one or more layers 102 of the circuit board 100. The conductive vias 108, 118 can be directly coupled to, or indirectly in conductive communication with, one or more conductive traces for exchanging electrical signals to other elements of the circuit board 100 and/or elements external to the circuit board 100. The conductive vias 108, 118 can be constructed and arranged for press-fit or solder tail connectors, or other connectors known to those of ordinary skill in the art, for example, pins 106, 116 or the like. Other vias often follow a pitch or spacing defined by the connector system. A conductive layer 104 can line the walls of the vias 108, 118, respectively. In doing so, the conductive vias 108, 118 can be constructed and arranged to exchange differential signals, respectively. Other conductive vias can include but not be limited to blind vias, buried vias, single-ended signaling vias, and/or other printed circuit board vias.

A pin or related conductive connector element 106 can be positioned in the first conductive via 108. A pin or related conductive connector element 116 can be positioned in the second conductive via 118. The pins 106, 116 are constructed and arranged to directly abut the conductive layer 104 along the sidewalls of the vias 108, 118, respectively, for establishing conductive signal paths between the layers of the circuit board 100 and the pins 106, 116, respectively, or more specifically, elements in conductive communication with the pins 106, 116, respectively. It is noted that, in this embodiment, the conductive layer 104 of the via 108, 118 is hollow, since it is arranged to receive and make electrical contact with a corresponding pin 106, 116 in at least its intermediate portion.

The circuit board 100 includes one or more air vias 120 or non-plated through holes between the conductive vias 108, 118 and extending from the top layer 102 through one or more layers. In an embodiment, the air via 120 is unplated and does not have a conductive layer lining its sidewall. Air is known for having a lower dielectric constant than PCB laminate materials. Thus, the air via 120 positioned between signals in a pair can result in less severe impedance discontinuity, and reduced crosstalk. In some embodiments, the air via 120 or through hole is at least partially filled with a material having a dielectric at or near that of air. Other benefits can include less signal reflection and loss. The air via 120 can include two or more small diameter vias, e.g., 14-mil, that may slightly overlap each other, e.g., snowman-shaped. In other embodiments, the air via 120 can be slot-shaped, e.g., 14-mil wide and 28-mil long. One or more air vias 120 can be positioned between a differential pair or single ended signals and a nearby ground. In some embodiments, to improve manufacturability, an air via 120 is constructed to include more than one aperture. For example, the abovementioned snowman-shaped air via can be formed of two neighboring small-diameter apertures, e.g., 14-mil× 28-mil. The air via 120 can be formed as a slot-shaped via by performing an etching step at the snowman-shaped air via. In some embodiments, the air via 120 can be constructed and arranged to have a shape that reduces impedance discontinuity or other undesirable signal-related issues otherwise known to occur in circuit board configurations. In some embodiments, as described herein, the air via 120 is constructed and arranged to adapt to pre-existing constraints of the circuit board, for example, to improve performance of a pre-configured circuit board by the inclusion of the air via 120.

Figure 2:
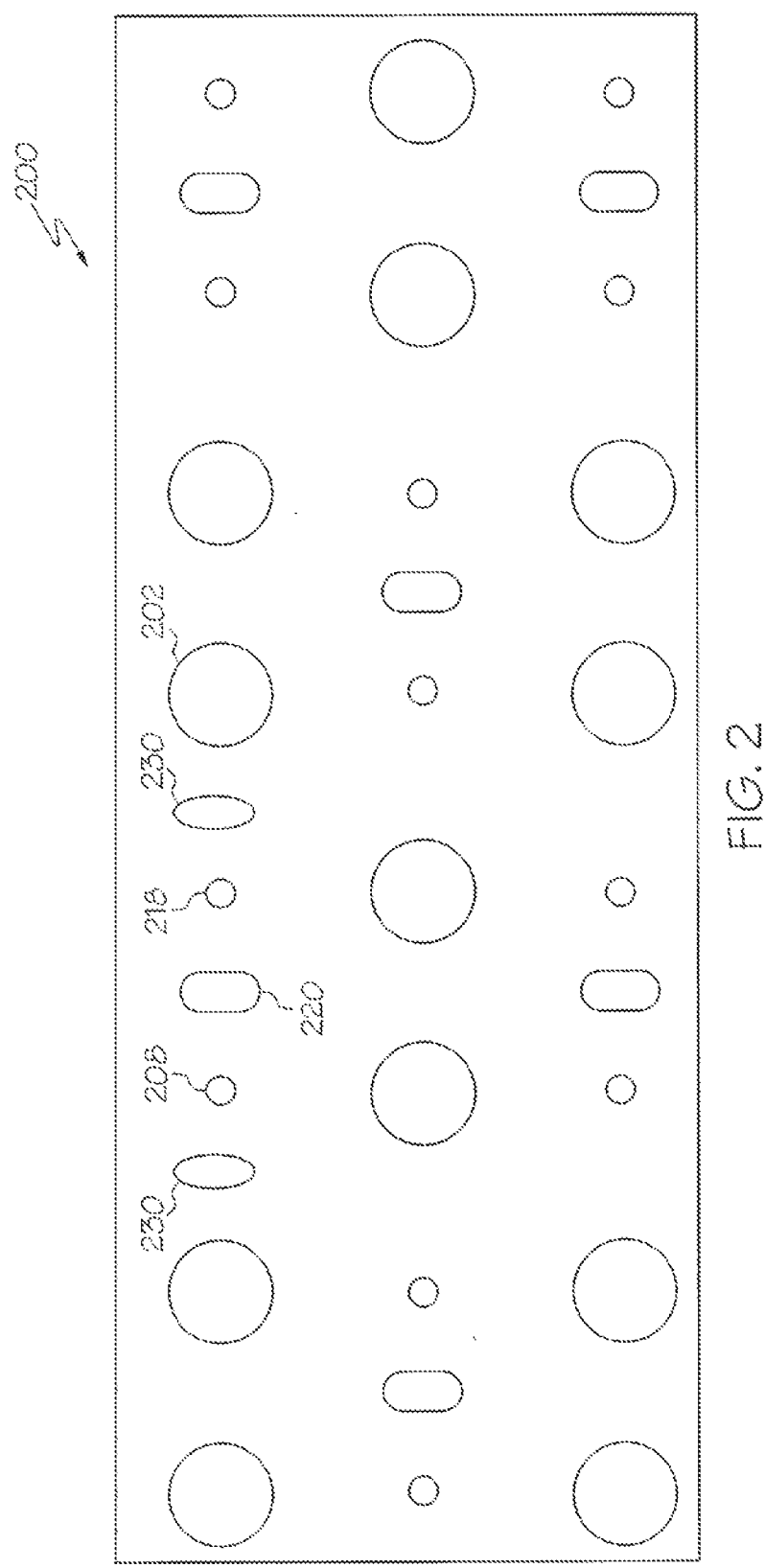
FIG. 2 is a top view of a backplane, in accordance with an embodiment.

FIG. 2 is a top view of a backplane 200, in accordance with an embodiment. Although a backplane 200 is shown and described, features described with reference to FIG. 2 can equally apply to other circuit boards.

The backplane 200 can include differential pair signal vias 208, 218, which can be similar to those described in FIG. 1. In other embodiments, the vias 208, 218 are standard signal vias or the like, for example, for exchanging radio frequency (RF) signals. A slot-shaped air via 220 can be positioned between the differential pair signal vias 208, 218. The air via 220 can have other shapes or configurations, such as the abovementioned snowman-shape. In some embodiments, signal vias 208, 218 do not include pads on top surfaces thereof, respectively, for example, described herein. In other embodiments, signal vias 208, 218 have pads on top surfaces thereof, which are of a width or related dimension that is less than that of a neighboring via 202. Accordingly, a neighboring via 202 can have a different configuration, for example, a different pad diameter, than that of one or both signal vias 208, 218. In other embodiments, one or more air slot vias 230 are positioned between the differential pair signal vias 208, 218 and adjacent ground vias. In other embodiments, one or more air slot vias 230 can be positioned between a single-ended signal via and an adjacent ground via. In the present embodiments, as well as in other embodiments herein, rather than including the hollow conductive layers 104 of the vias 108, 118 of the embodiment of FIG. 1, the signal vias 208, 218 are partially or completely filled with conductive material.

Figure 3A:
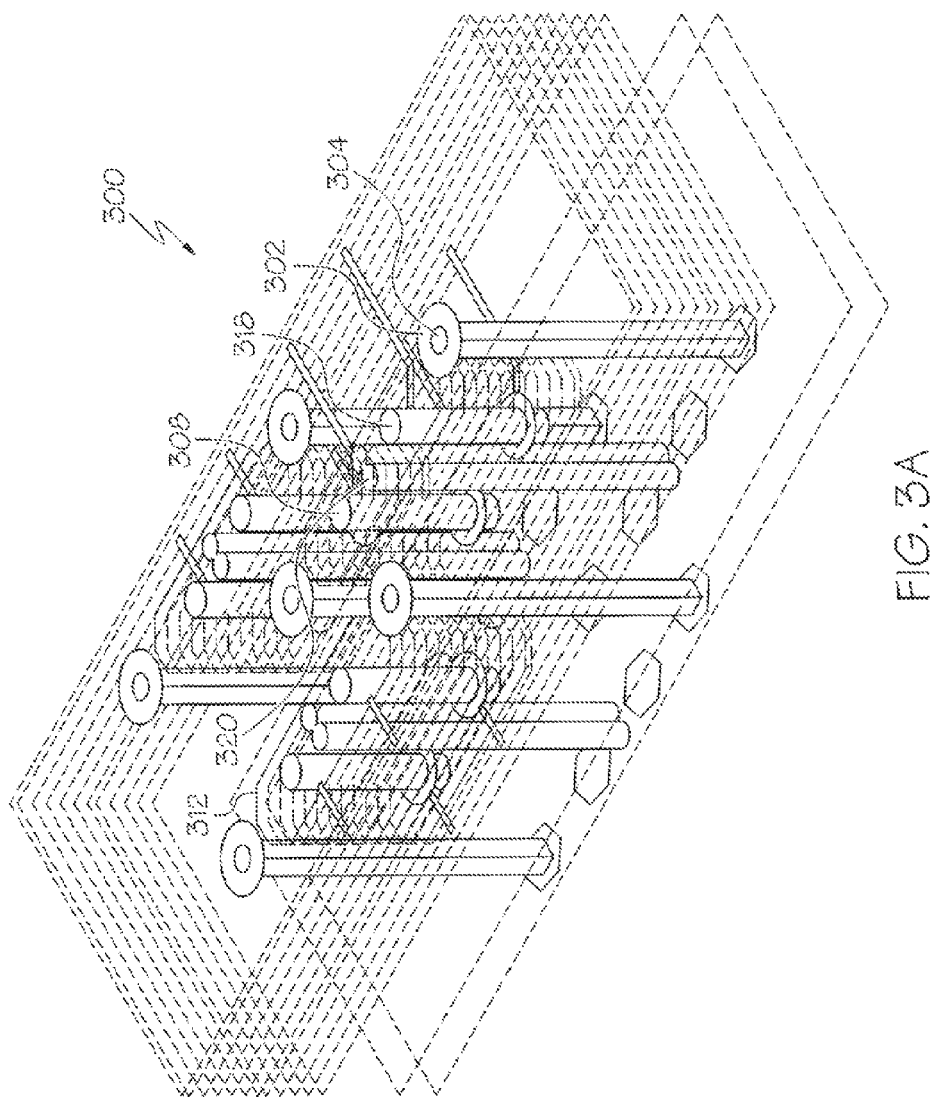
FIG. 3A is a perspective view of a circuit board, in accordance with an embodiment.
Figure 3B:
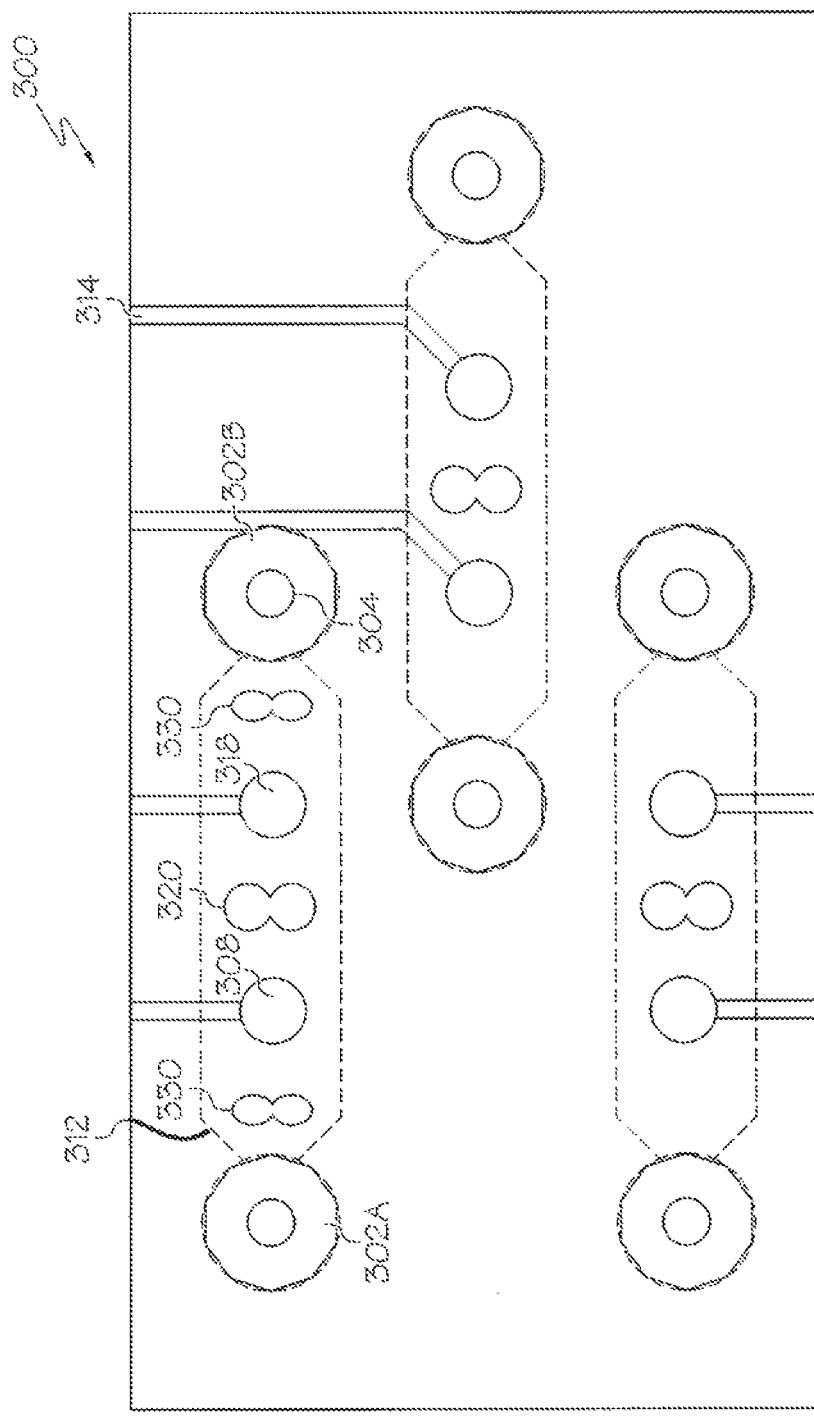
FIG. 3B is a plan view of a circuit board, in accordance with an embodiment.

FIG. 3A is a perspective view of a circuit board 300, in accordance with an embodiment. FIG. 3B is a plan view of a circuit board 300, in accordance with an embodiment.

A pair of signal vias 308, 318 do not include pads on top surfaces thereof, respectively, or have a pad width that is less than a pad width of one or more vias adjacent or otherwise proximal to the signal vias 308, 318, or connector pin vias. For purposes of the present disclosure, signal vias that have a width at their top or bottom surfaces that is not greater than a width of the body portion of the signal via at an intermediate portion thereof so that the signal via only abuts the inner sidewall of the opening in the circuit board in which the via is positioned are referred to herein as "padless" signal vias.

Conductive signal traces 314 are electrically connected to the signal vias 308, 318, for example, pads about signal vias. In some embodiments, the conductive signal traces 314 connect to the signal vias 308, 318 at intermediate layers of the circuit board 300, and not on the top and bottom surfaces. In some embodiments, the conductive traces 314 can extend between adjacent rows of connector pins. At least one neighboring via 302A, 302B (generally, 302) can include a pad 304, which can be in communication with a conductive layer, and/or contacts or other connectors (not shown) extending along a wall of the neighboring via 302. In some embodiments, the neighboring vias 302A, 302B are ground vias or the other reference conductive vias constructed and arranged to supply a fixed voltage level, such as a positive, negative, and/or zero voltage level, or a ground voltage level. In some embodiments, the absence of a top layer pad 304 at the signal via pair 308, 318, i.e. a "padless" signal via pair 308, 318 can reduce crosstalk, signal loss, transmission loss, radiation and susceptibility, and/or other undesirable effects between the vias 308, 318 and/or at a single via, and/or can raise the differential impedance, and/or reduce the impedance mismatch through the vias 308, 318. In some embodiments, one or more air vias 320 similar to other air vias described herein can be positioned between the signal pair 308, 318. In other embodiments, one or more air slot vias 330 (not shown in FIG. 3A) can be positioned between the differential pair signal vias 308, 318 and/or a single-ended signal via and one or more adjacent ground vias 302. The introduction of one or more air vias between differential vias, or a single-ended signal and its return path vias, and/or the removal or absence of top pads can also permit an alternative or complementary approach with respect to minimizing impedance mismatch, crosstalk coupling, and/or other undesirable effects. In various embodiments, the one or more air vias 120, 220, 230, 320, 330, 820 can extend between a top surface and a bottom surface of the circuit board, between a top surface and an intermediate layer of the circuit board without extending to the bottom surface, between a bottom surface and an intermediate layer of the circuit board without extending to the top surface, or between intermediate layers of the circuit board without extending to the top surface or bottom surface.

In some embodiments, an anti-pad 312 extends in a horizontal direction between reference vias 302A and 302B, for example, ground vias and through one or more of the layers of the circuit board in the vertical direction. The term "anti-pad" as used herein, and in industry, includes a region of the circuit board that is largely devoid of signal traces. In the present embodiment, the anti pad 312 surrounds, in the horizontal direction, the air via 320 and conductive vias 308, 318. The anti-pad 312 further includes conductive traces that service the conductive vias from an intermediate layer of the circuit board, but is largely or completely devoid of other conductive traces. As described herein, the air via 320 is constructed and arranged to comply with geometry constraints such as the anti-pad geometry.

Figure 4A:
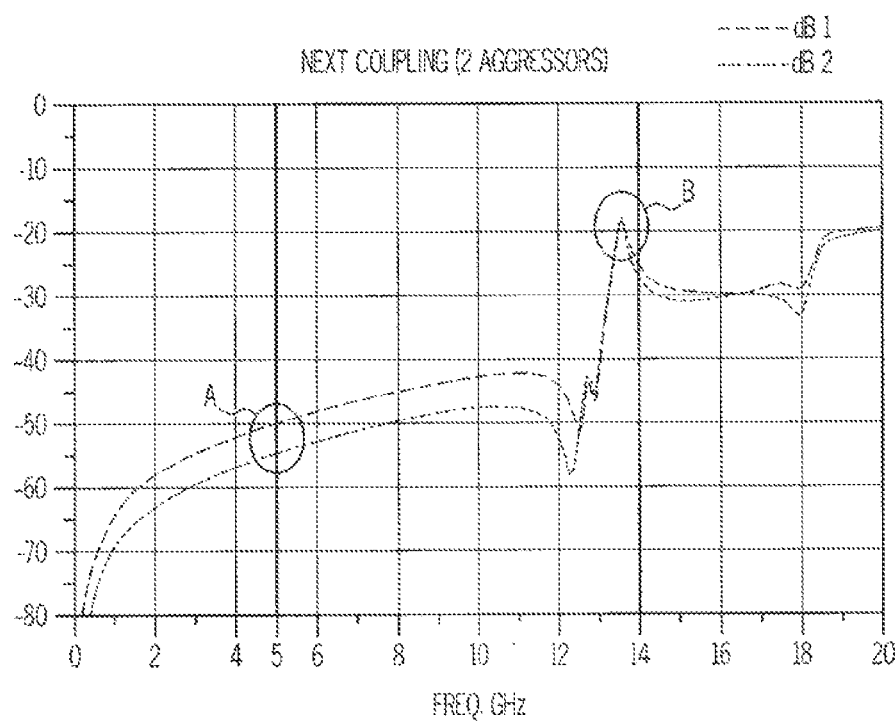
FIGS. 4A-4C are graphs illustrating a multi-pair near-end crosstalk (NEXT) coupling comparison, in accordance with an embodiment.
Figure 4B:
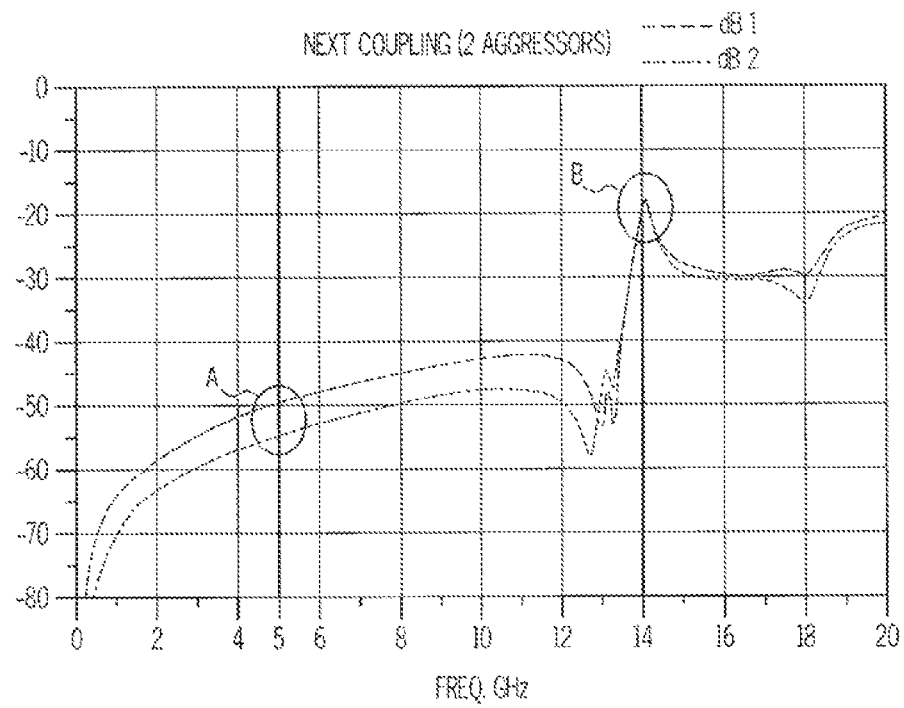
Figure 4C:
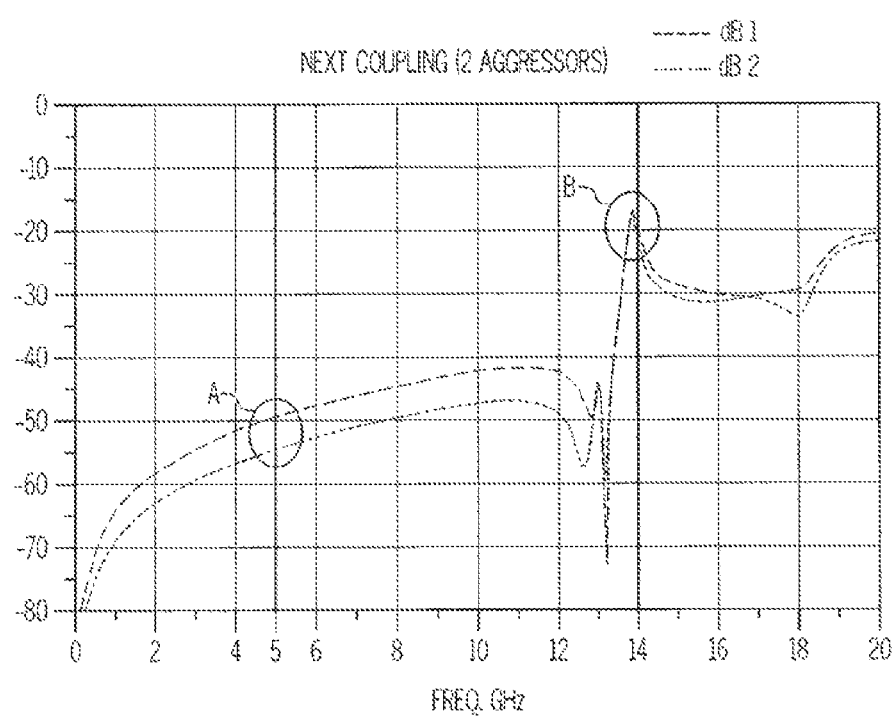

FIGS. 4A-4C are graphs illustrating multi-pair near-end crosstalk (NEXT) coupling comparisons, in accordance with an embodiment.

The graph in FIG. 4A shows the measured differential near-end crosstalk between two signal lines of a conventional circuit board, for example, two aggressor pairs. The graph in FIG. 4B shows the measured differential near-end crosstalk between two signal lines of a circuit board having no top pads and no air vias. The graph in FIG. 4C shows the measured near-end crosstalk between two signal lines of a circuit board having no top pads and an air via, for example, shown at FIGS. 1, 2, 3A, and 3B.

As shown in FIGS. 4A-4C, near-end crosstalk coupling is not substantially affected at 5 GHz (see locations A). However, for example, crosstalk peaking at a via stub resonance frequency about 14 GHz is worse in the conventional circuit of FIG. 4A (see locations B), with the resonance occurring at a frequency that is nearly 1 GHz lower than FIG. 4B and FIG. 4C.

Figure 5:
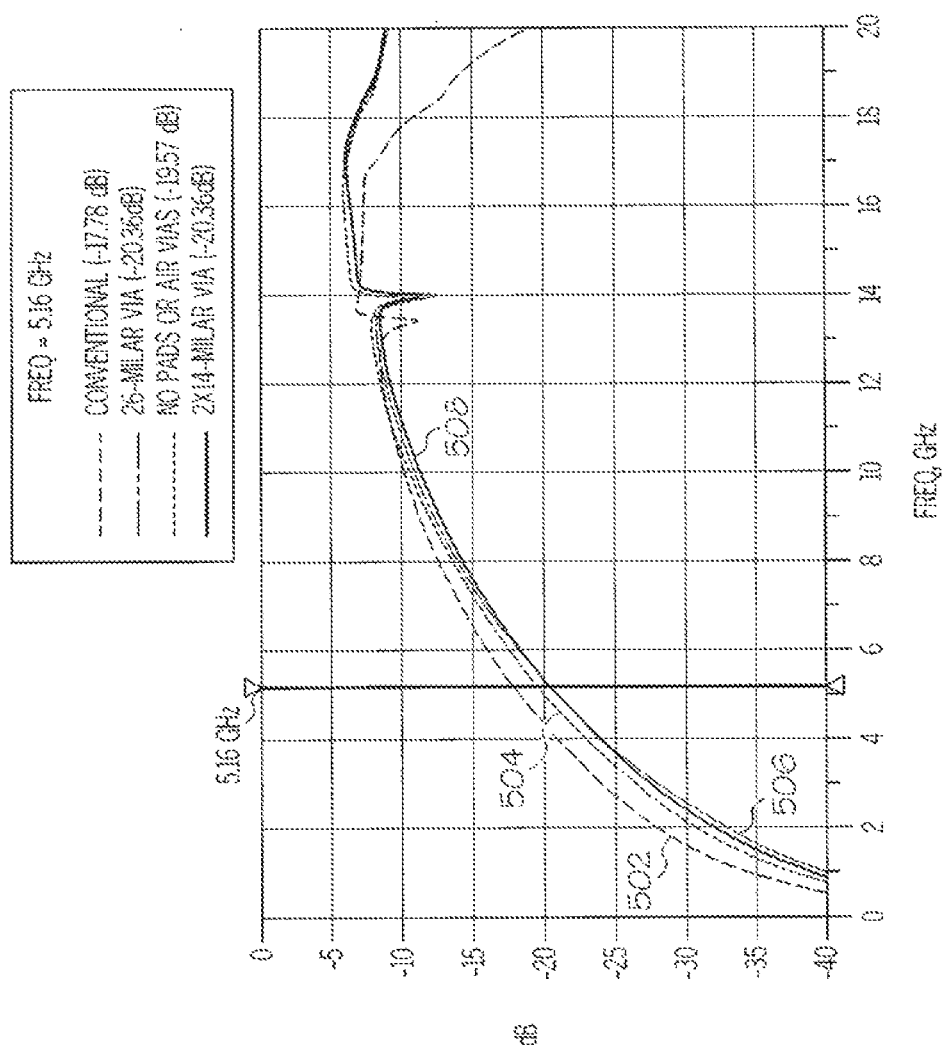
FIG. 5 is a graph illustrating a comparison between circuit boards with respect to differential return loss, in accordance with an embodiment.

FIG. 5 is a graph illustrating a comparison between circuit boards with respect to differential return loss, in accordance with an embodiment. In particular, a return loss plot is shown along a frequency range (0-20 GHz) for a conventional circuit board configuration versus three other circuit board configurations, each according to embodiments of the present inventive concepts, which can provide information related to impedance discontinuity. Plot 502 corresponds to simulation results of a conventional PCB described herein. Plot 504 corresponds to simulation results of a circuit board having no top pads and no air vias. Plot 506 corresponds to simulation results of a circuit board having no top pads and an air via having a 26-mil diameter. Plot 508 corresponds to simulation results of a circuit board having no top pads and a two air vias, each having a 14-mil diameter, for example, having a configuration approximating a slot. Accordingly, FIG. 5 illustrates the effectiveness of the inclusion of air vias having various geometries, spacings, pitch configurations, or the like.

As shown in FIG. 5, the absence or reduction in size of a top pad results in a significant improvement over the conventional configuration 502. For example, a ~1.8 dB improvement at 5 GHz with respect to the circuit board configuration 504. As also shown in FIG. 5, the absence or reduction in size of a top pad can also result in a lower stub resonance frequency. Plots 506 and 508 illustrate that an air via arrangement with different geometries can reduce turn loss, for example, by an additional 0.8 dB.

Figure 6:
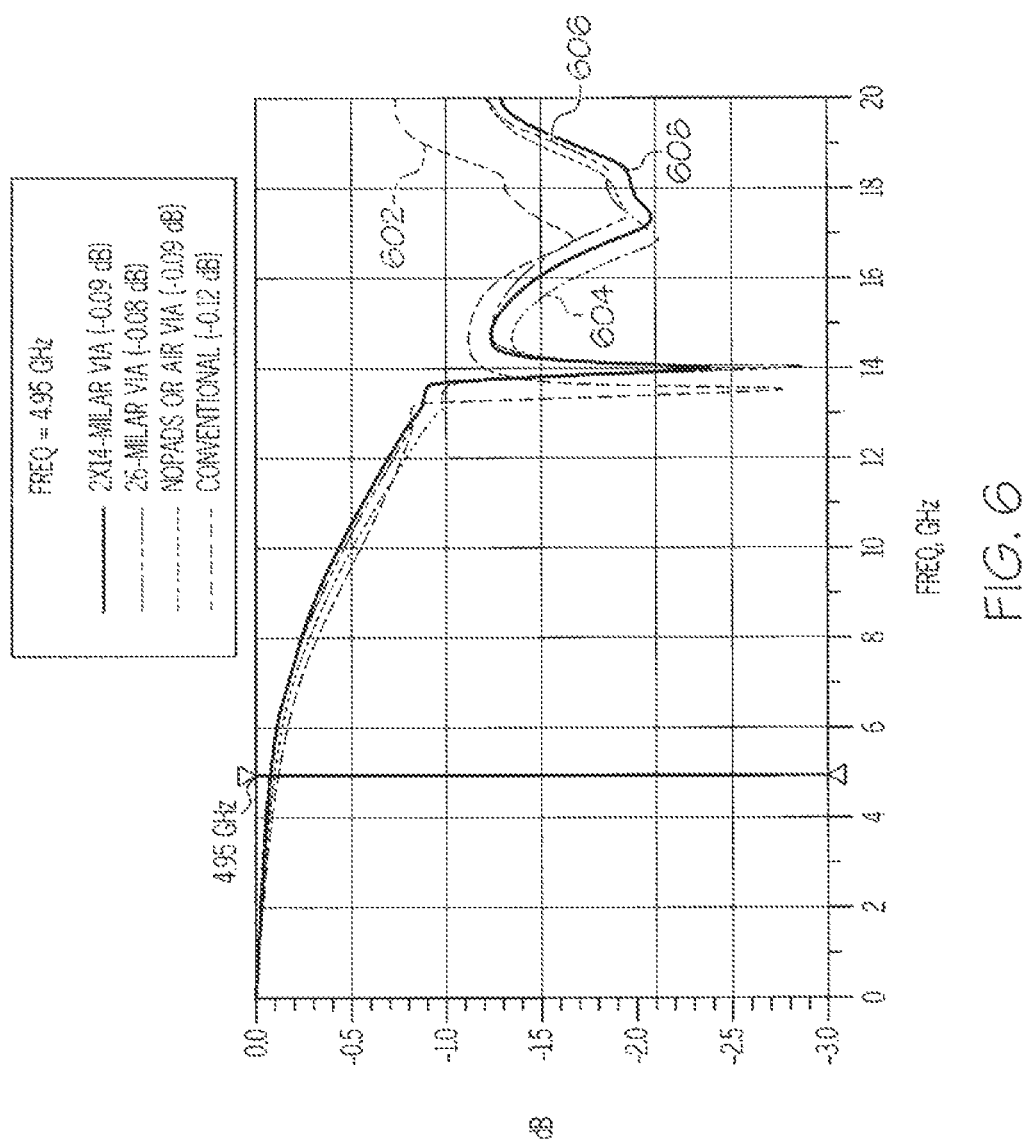
FIG. 6 is a graph illustrating a comparison between circuit boards with respect to differential insertion loss, in accordance with an embodiment.

FIG. 6 is a graph illustrating a comparison between circuit boards with respect to differential insertion loss, in accordance with an embodiment. In particular, an insertion loss plot is shown along a frequency range (0-20 GHz) for a conventional circuit board configuration versus three other circuit board configurations, each according to embodiments of the present inventive concepts. Plot 602 corresponds to simulation results of a conventional PCB described herein. Plot 604 corresponds to simulation results of a circuit board having no top pads and no air vias. Plot 606 corresponds to simulation results of a circuit board having no top pads and an air via having a 26-mil diameter. Plot 608 corresponds to simulation results of a circuit board having no top pads and a two air vias, each having a 14-mil diameter, for example, in a configuration approximating a slot or an hourglass or snowman-shape.

As shown in FIG. 6, there is little difference in forward loss between the via configurations at lower frequencies, but, for example, insertion loss is improved by 1 dB or more in configurations 606 and 608 with air vias at frequencies above 10 GHz. However, for example, the via stub resonant null is slightly less severe in configurations 604 and 608. The resonant null is at a slightly higher frequency than the baseline configuration 602.

Figure 7A:
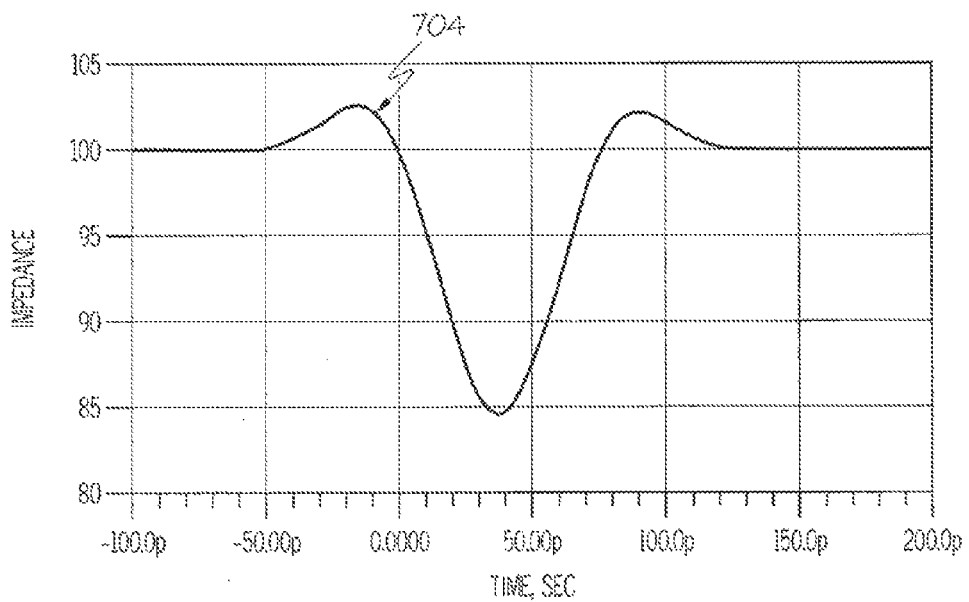
FIGS. 7A and 7B are graphs illustrating a time domain impedance profile of circuit boards having different air via configurations, in accordance with an embodiment.
Figure 7B:
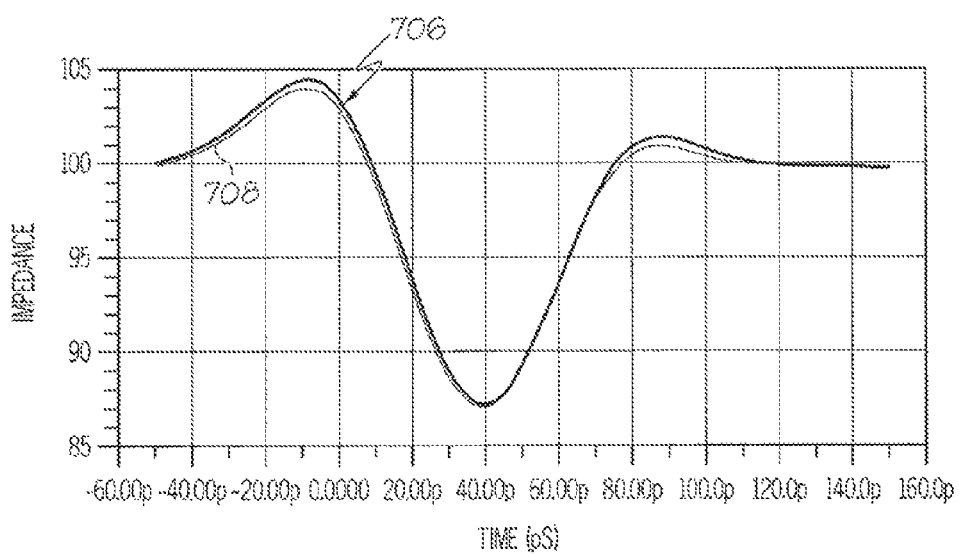

FIGS. 7A and 7B are graphs illustrating a time domain impedance profile of circuit boards having different air via configurations, in accordance with an embodiment. A time domain impedance profile can be obtained by performing an inverse Fast Fourier Transform of the frequency domain characterization using an effective edge rate, for example, approximately 17 pS, and applying a Hamming type windowing to reduce Nyquist ringing.

Profile 704 corresponds to a time domain impedance profile of a circuit board having the baseline configuration. Profile 706 corresponds to a time domain impedance profile of a circuit board having no top pads and a slot-shaped air via having a 26-mil diameter. Profile 708 corresponds to a time domain impedance profile of a circuit board having no top pads and a two air vias, each having a 14-mil diameter. As shown in FIG. 7, the time domain impedance profile is essentially identical for Profile 706 and Profile 708, with the exception of both profiles, for example, showing a significant improvement of about 4 ohms with respect to the baseline Profile 704. Profile 708 of the two 14 mil air vias is shown as having a slightly less inductive deviation than that of profile 706 with a 26 mil air via. The capacitive deviation magnitude is the same in each profile.

In view of the foregoing, a feature of the present inventive concepts is that the removal of a top pad can have an unexpectedly large positive effect on differential return loss. Another feature is that the presence of an air via, for example, a 26-mil air via, two 14 mil air vias, or a 14×26 mil air slot, can improve return loss performance, for example, by approximately 1 dB, and that multiple 12-14 mil air vias constructed and arranged the form of a slot, "snowman", or related shape can provide results similar to those associated with a single larger air via, for example, a round air via having a 26 mil diameter. The combination of the absence of a top pad and the presence of a 26 mil differential air via, two 14 mil air vias, or a 14×26 mil air slot can improve a differential return loss, for example, by over 3 dB at 5 GHz. Also, the maximum differential impedance $Z_{diff}$ deviation in the impedance profile, for example, can be improved by almost 4Ω.

Industry-standard compliant form factors periodically run into performance limits that are based on the connector system selected for that standard. In some cases, the physical arrangement of the connector signal and ground pins may be unsuitable as the data rate and frequency increases. In order to improve the performance of these industry-standard compliant form factors, a combination of layout features including differential anti-pads, top pad suppression, air vias, and back-drill (or sequential lamination) can be used to tune the via impedance, minimize resonances, reflections and return loss, and minimize crosstalk. These techniques can allow these industry-standard compliant form factors to operate at higher data rates (and correspondingly higher frequencies) of a newer generation of serial fabrics, without breaking the backward-compatibility with the older generations of serial fabrics, and thereby improving the performance of a low performance connector, notwithstanding constraints related to the layout and geometry of the industry-standard connector system.

Figure 8:
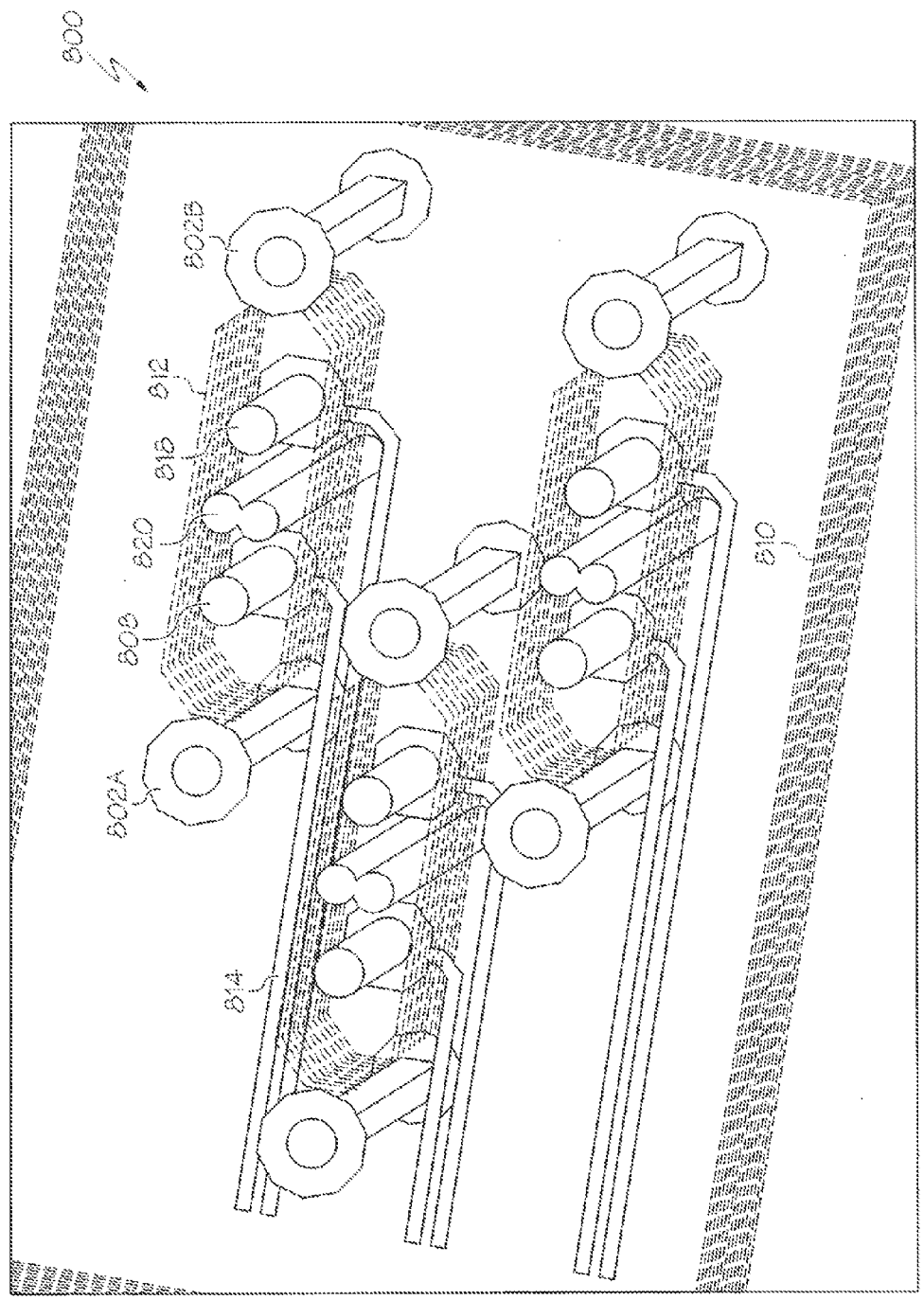
FIG. 8 is a perspective view of a circuit board, in accordance with another embodiment.

FIG. 8 is a perspective view of a circuit board 800, in accordance with another embodiment. FIG. 9 is a plan view of the circuit board 800 of FIG. 8. The circuit board 800 can be similar to other embodiments herein, for example, printed wiring boards, so repetitive details are omitted for brevity. The circuit board 800 is preferably a multi-layer board comprising conductive elements on different layers electrically connected to each other and/or external elements with vias or the like, and including components embedded in a substrate of the various layers. The layers of the circuit board 800 can include but not be limited to a source power layer, a ground plane, signal layer, or the like.

The circuit board 800 has a layout that includes several rows of elements extending in the horizontal direction, each row including first ground via 802A, first signal via 808, air via 820, second signal via 818, second ground via 802A, and an optional anti-pad 812 (in FIG. 2, for example, the circuit board 200 does not include an anti-pad), which can extend through one or more layers of the circuit board 800. In some embodiments, no air vias are present between a signal via 808, 818 and a neighboring ground via 802A, 802B. Although a ground via 802A, 802B are shown and described, vias 802A and 802B can equally apply to other reference vias, source power vias, and so on. The signal vias 808, 818 can be differential pair vias, blind vias, or other conductive vias. In some embodiments, the first signal via 808 and the second signal via 818 are each padless, for example, similar to conductive vias 308, 318 described herein, wherein the top layer pad on the circuit board is minimized in width relative to other pads in the layout, or otherwise suppressed, removed or absent. Accordingly, the circuit board 800 is constructed to reduce crosstalk, signal loss, or related undesirable effects.

Routing channels each include each respective sets of conductive traces 814 that are electrically connected to the signal vias 808, 818, for example, pads about signal vias. The conductive traces 814 can extend between adjacent rows of connector pins, for example, in a horizontal direction parallel to adjacent rows each including a first ground via 802A, a first signal via 808, an air via 820, a second signal via 818, a second ground via 802A, respectively, for providing an electrical path between conductive elements of the same or different layers. In some embodiments, the differential pair 808, 818 is edged coupled so that the traces 814 are routed side-by-side on the same layer. A significant portion of the routing channel 814 is needed for routing edge-coupled differential pairs, so the amount of available space for the air vias 820 is limited by manufacturing or geometry constraints. In other embodiments, edge-coupled differential pairs in the routing channel 814 are connected to connector pins (not shown) in such a way as to avoid the air via 820 and maintain minimum spacings between traces and reference conductive vias 802, such as ground vias, power vias, and so on.

In embodiments where the anti-pad 812 is present, the anti-pad 812 extends in a horizontal direction from the first ground via 802A to the second ground via 802B, and surrounds the first signal via 808, the second via 818, and the air via 820. The anti-pad 812 has a geometry that is constrained by the design and layout of the circuit board 800, for example, the presence and location of conductive traces 814 adjacent to the ground planes, or other elements of the circuit board 800. The circuit board fabrication process limits the geometry of the air via(s) 820.

Accordingly, a feature of the present inventive concepts is that the air via 820 is formed to meet or exceed signal quality and manufacturability goals in an environment with known constraints, instead of modifying the design to remove the constraints and to accommodate the addition of the air via. In particular, the size and location of air vias 802 are determined in view of manufacturing constraints of the printed wiring board, for example, to maintain minimum spacings between conductive features and reference conductive vias.

The inclusion of air vias 820 within the differential anti-pad 812 improves signal integrity, and is applied to the circuit board 800 having a number of constraints while also satisfying signal quality and manufacturability goals.

One available region on the circuit board 800 for positioning the air vias 802 for impedance modification is between the signal vias 808, 818. The air vias 820 are constructed and arranged to comply with such manufacturing constraints of the circuit board 800, while maintaining minimum spacings between the traces and non-conductive elements. In particular, the air via 820 geometry is determined so that it doesn't abut a copper trace or other conductive element, and maintains a minimum spacing between copper and air, for example, 10 mil. Accordingly, the air via 820 is physically separate from the traces 814, so as to not abut the traces 814, and that there is a spacing, or dielectric region, between the traces 814 and the wall of the air via 820. The location, shape, and size of the air via are additionally constrained by the physical geometry of the connector system; thus the air via must satisfy all of these different constraints. Thus, the arrangement shown in FIGS. 8 and 9 maintains a minimum copper-to-air clearance, in particular; between conductive elements such as signal vias, traces, and the like, and the air via 820, minimizing the impedance variation as the traces 814 span the anti-pad region 812.

Other constraints include the diameter dl of connector pin vias, and/or pitch between adjacent connector pins, for example, pins 106, 116 of FIG. 1. It is preferable that the diameter dl of the connector pin via be as small as possible, for example to reduce via capacitance. A smaller via diameter at signal vias 808, 818 provides for a larger dielectric region between signal vias 808; 818, which in turn permits a larger air via 820 to be formed than a configuration that includes larger diameter signal vias. The pin pitch constraint can affect other geometries such as anti-pad size, adding further constraints with respect to the air via 820.

In embodiments where an anti-pad 812 is present, the geometry of the differential anti-pad 812 can serve as another constraint. Designers and manufacturers desire the anti-pad 812 to be as large as possible without adversely affecting the routing channels 814 for the differential pairs 808, 818. Accordingly, the air via 820 is constructed and arranged to have a geometry that accommodates the size of the anti-pad 812 in a manner that complies with one or more other constraints, for example, the location of the routing channels 814, for a minimum copper to air clearance, which can affect reliability of the system and electromagnetic interference (EMI) from fringing fields. Thus, the air via 820 can be constructed and arranged in the circuit board 800 having a predetermined design, layout, and geometry, and complying with the constraints described herein with no need to modify the design, layout, or geometry of the circuit board 800.

Another constraint includes the geometry, e.g., width and spacing, of the differential pair traces 814, which can affect impedance and forward loss, or cause other undesirable effects, and trace pitch which may affect differential impedance and fiber weave skew, or cause other undesirable effects.

The air via drill size can be constrained by one or more of the differential anti-pad geometry, minimum copper to air clearance, and differential pair pad diameter described herein. A related constraint is the air via drill registration, which can affect the drill size. A related constraint is the air via drill overlap, for example, between neighboring air vias, which is preferably constructed and arranged to be a small as possible within standard PCB manufacturing capabilities.

Another constraint is the differential pair lead-in or "pad escape," which is affected by one or more of the connector pin pitch, differential anti-pad geometry, differential pair trace width, spacing, and pitch, and copper to air clearance constraints described herein. This may not introduce excessive phase skew within the differential pair. The systems and methods in accordance with some embodiments compensate for skew and impedance variations due to the short length of mismatched length un-coupled traces in the region of the differential pair pad escape. Here, the longer single-ended trace run can have its width reduced so that the effective differential impedance remains constant, and the skew associated with the longer single-ended trace can be adjusted outside of the connector pin field.

In embodiments where the differential pair includes a pad, the pad diameter may be constrained by the pin via diameter, and can affect the air via region.

These systems and methods, in combination with the top pad removal, air vias and the anti-pad feature, optimize the performance of the high speed differential pairs by minimizing return loss, resonances, skew, and crosstalk.

While the present inventive concepts have been particularly shown and described above with reference to exemplary embodiments thereof, it will be understood by those of ordinary skill in the art, that various changes in form and detail can be made without departing from the spirit and scope of the present inventive concepts.

What is claimed is:

1. A circuit board, comprising:
a plurality of layers;
first and second reference conductive vias extending in a vertical direction through at least a portion of the plurality of layers;
first and second signal conductive vias extending in the vertical direction between and spaced apart in a horizontal direction from the first and second reference conductive vias through at least a portion of the plurality of layers, a topmost layer being padless about at least one of the first and second signal conductive vias, an intermediate layer between the topmost layer and a bottommost layer of the plurality of layers including a pad about the at least one of the first and second signal conductive vias;
a dielectric region extending in the vertical direction between the first and second signal conductive vias;
an air via extending in the vertical direction through the dielectric region between the first and second signal conductive vias; and
an anti-pad extending in the horizontal direction between the first and second reference conductive vias and surrounding in the horizontal direction the padless topmost layer of the first and second signal conductive vias, the air via, and the dielectric region.

2. The circuit board of claim 1, wherein the first and second signal conductive vias each has a width that is uniform in the vertical direction through the at least the portion of the plurality of layers.

3. The circuit board of claim 1, further comprising a conductive trace extending in the horizontal direction from each of the first and second signal conductive vias for providing an electrical path between conductive elements of the layers.

4. The circuit board of claim 3, wherein the conductive traces extending from the first and second signal conductive vias are the only conductive traces present in the anti-pad.

5. The circuit board of claim 3, wherein the conductive traces extend in the horizontal direction.

6. The circuit board of claim 3, wherein the dielectric region includes a clearance distance between the air via and the conductive traces, so that the conductive traces are unexposed in the air via.

7. The circuit board of claim 1, wherein the circuit board comprises a backplane, a plug-in module, a mezzanine module, or a combination thereof.

8. The circuit board of claim 1, wherein the first and second signal conductive vias are a differential pair.

9. The circuit board of claim 1, wherein the first and second reference conductive vias are ground vias, power vias, or a combination thereof.

10. The circuit board of claim 1, wherein the air via extends from a top layer to a bottom layer of the plurality of layers.

11. The circuit board of claim 1, wherein the air via extends from a top or a bottom layer to an intermediate layer of the plurality of layers.

12. The circuit board of claim 1, wherein the air via extends exclusively between intermediate layers of the plurality of layers, and does not extend to a top or a bottom layer.

13. The circuit board of claim 1, further comprising secondary air slot vias extending in the vertical direction between the first signal conductive via and the first reference conductive via and between the second signal conductive via and the second reference conductive via.

14. A circuit board, comprising:
a plurality of layers;
first and second reference conductive vias extending in a vertical direction through at least a portion of the plurality of layers;
first and second padless signal conductive vias extending in the vertical direction between and spaced apart in a horizontal direction from the first and second reference conductive vias through the layers, a topmost layer being padless about at least one of the first and second signal conductive vias, an intermediate layer between the topmost layer and a bottommost layer of the plurality of layers including a pad about the at least one of the first and second signal conductive vias;
a dielectric region extending in the vertical direction between the first and second signal conductive vias; and
an anti-pad extending in the horizontal direction between the first and second reference conductive vias and surrounding in the horizontal direction the padless signal conductive vias and the dielectric region.

15. The circuit board of claim 14, wherein the first and second padless signal conductive vias each has a width that is uniform in the vertical direction through the at least the portion of the plurality of layers.

16. The circuit board of claim 14, further comprising an air via extending through the dielectric region between the first and second signal conductive vias.

17. The circuit board of claim 16, wherein the air via extends from a top layer to a bottom layer of the plurality of layers.

18. The circuit board of claim 16, wherein the air via extends from a top or a bottom layer to an intermediate layer of the plurality of layers.

19. The circuit board of claim 16, wherein the air via extends exclusively between intermediate layers of the plurality of layers, and does not extend to a top or bottom layer.

20. The circuit board of claim 16, further comprising secondary air slot vias extending in the vertical direction between the first signal conductive via and the first reference conductive via and between the second signal conductive via and the second reference conductive via.

21. The circuit board of claim 16, wherein the dielectric region includes a clearance distance between the air via and the first and second signal conductive vias.

22. The circuit board of claim 14, further comprising a conductive trace extending in the horizontal direction from each of the first and second signal conductive vias for providing an electrical path between conductive elements of the layers.

23. The circuit board of claim 22, wherein the conductive traces extending from the first and second signal conductive vias are the only conductive traces present in the anti-pad.

24. The circuit board of claim 22, wherein the dielectric region includes a clearance distance between the air via and the first and conductive traces so that the conductive traces are unexposed in the air via.

25. The circuit board of claim 22, wherein the conductive traces extend in a direction that is parallel to the horizontal direction.

26. The circuit board of claim 14, wherein the circuit board comprises a backplane, a plug-in module, a mezzanine module, or a combination thereof.

27. The circuit board of claim 14, wherein the first and second signal conductive vias are a differential pair.

28. The circuit board of claim 14, wherein the first and second reference conductive vias are ground vias, power vias, or a combination thereof.

29. A circuit board, comprising:
a plurality of layers;
first and second reference conductive vias extending in a vertical direction through at least a portion of the plurality of layers;
first and second signal conductive vias extending in the vertical direction between and spaced apart in a horizontal direction from the first and second reference conductive vias through at least a portion of the plurality of layers;
a dielectric region extending in the vertical direction between the first and second signal conductive vias;
an air via extending in the vertical direction through the dielectric region between the first and second signal conductive vias, the first and second signal conductive vias having a length extending in the vertical direction that is less than a length in the vertical direction of the first and second reference conductive vias and the air via; and
an anti-pad extending in the horizontal direction between the first and second reference conductive vias and surrounding in the horizontal direction the first and second signal conductive vias, the air via, and the dielectric region.

30. The circuit board of claim 29, wherein a topmost layer is padless about the first and second signal conductive vias.

31. The circuit board of claim 30, wherein an intermediate layer between the topmost layer and a bottommost layer of the plurality of layers includes a pad about the at least one of the first and second signal conductive vias.

32. The circuit board of claim 31, further comprising a conductive trace extending in the horizontal direction from the pad about the each of the first and second signal conductive vias for providing an electrical path between conductive elements of the layers.

33. A circuit board, comprising:
a plurality of layers;
first and second reference conductive vias extending in a vertical direction through at least a portion of the plurality of layers;
first and second signal conductive vias extending in the vertical direction between and spaced apart in a horizontal direction from the first and second reference conductive vias through at least a portion of the plurality of layers;
a dielectric region extending in the vertical direction between the first and second signal conductive vias;
an air via extending in the vertical direction through the dielectric region between the first and second signal conductive vias, the first and second signal conductive vias extending from a top or a bottom layer to an intermediate layer of the plurality of layers; and
an anti-pad extending in the horizontal direction between the first and second reference conductive vias and surrounding in the horizontal direction the first and second signal conductive vias, the air via, and the dielectric region.

34. The circuit board of claim 33, wherein a topmost layer is padless about the first and second signal conductive vias.

35. The circuit board of claim 34, wherein an intermediate layer between the topmost layer and a bottommost layer of the plurality of layers includes a pad about the at least one of the first and second signal conductive vias.

36. The circuit board of claim 35, further comprising a conductive trace extending in the horizontal direction from the pad about the each of the first and second signal conductive vias for providing an electrical path between conductive elements of the layers.

* * * * *